United States Patent [19]

Ebata

[11] Patent Number: 4,772,485

[45] Date of Patent: Sep. 20, 1988

[54] PROCESS CONTROL SYSTEM OF SEMICONDUCTOR VAPOR PHASE GROWING APPARATUS

[75] Inventor: Hitoshi Ebata, Mishima, Japan

[73] Assignee: Toshiba Kikai Kabushiki Kaisha, Tokyo, Japan

[21] Appl. No.: 873,119

[22] Filed: Jun. 10, 1986

Related U.S. Application Data

[63] Continuation of Ser. No. 657,146, Oct. 3, 1984, abandoned.

[30] Foreign Application Priority Data

Oct. 5, 1983 [JP] Japan ................................. 58-184953
Oct. 5, 1983 [JP] Japan ................................. 58-184954
Oct. 5, 1983 [JP] Japan ................................. 58-184955

[51] Int. Cl.$^4$ ............................................. C23C 16/00
[52] U.S. Cl. ............................................ 427/8; 427/9; 427/10; 427/248.1
[58] Field of Search ....................................... 427/248.1

[56] References Cited

U.S. PATENT DOCUMENTS 4,331,702  5/1982  Hieber et al. ........................ 427/10
4,430,959  2/1984  Ebata et al. ..................... 118/725 X Primary Examiner—Richard Bueker
Attorney, Agent, or Firm—Cushman, Darby & Cushman

[57] ABSTRACT

In a semiconductor vapor phase growing apparatus of the type disclosed in U.S. Pat. No. 4,430,959 dated Feb. 14, 1984, the thickness and resistivity of the semiconductor grown on a substrate by vapor phase growing technique are controlled by a sequence program. The content of the sequence program is corrected to approach a target thickness and a target resistivity at each batch operation. In a modification, an auxiliary mass flow valve is provided for each main mass flow valve and when the main mass flow valve becomes faulty, it is substituted by the auxiliary mass flow valve so as to continue the normal operation of the vapor phase growing apparatus.

3 Claims, 15 Drawing Sheets

FIG. 8

| PP NO | TIME | GAS FLOW | | | | | | θ°C |
|---|---|---|---|---|---|---|---|---|
| | | N₂ | H₂ | DN | DP | SiCl₄ | HCl | TEMPERATURE |
| 1 | 3:00 | FN1ℓ | | | | | | |
| 2 | 3:00 | | FH2ℓ | | | | | |
| 3 | 3:00 | | ↓ | | | | | θ1 |
| 4 | 3:00 | | | | | | | θ2 |
| 5 | 3:00 | | | | | | FHCL | |
| 6 | 3:00 | | | | | | ↓ | |
| 7 | 3:00 | | | | | | | ↓ |
| 8 | 3:00 | | | | | | | θ3 |
| 9 | 3:00 | | | | FDP | FS1 | | ↓ |
| 10 | 3:00 | | | | ↓ | ↓ | | |
| 11 | 3:00 | | ↓ | | | | | |
| 12 | | | | | | | | |
| 13 | | | | | | | | |
| 14 | | | | | | | | ↓ |
| 15 | 3:00 | | ↓ | | | | | |
| 16 | 3:00 | | ↓ | | | | | |
| 17 | 3:00 | FN17ℓ | | | | | | |
| (END) | | | | | | | | |

FIG.9

| | |
|---|---|
| PP(1) | SEQUENCE NUMBER = 1 |
| | DATA SIZE |
| | SEQUENCE TIME |
| | DATA BIT CODE |
| | TEMPERATURE OR GAS FLOW QUANTITY |
| | ⋮ |
| PP(N) | SEQUENCE NUMBER = N |
| | DATA SIZE |
| | SEQUENCE TIME |
| | DATA BIT CODE |
| | TEMPERATURE OR GAS FLOW QUANTITY |

FIG.16

| 1 | TARGET RESISTIVITY |
|---|---|
| 2 | SECOND INTERBATCH RESISTIVITY CORRECTION VALUE |
| ...... | |
| N | NTH INTERBATCH RESISTIVITY CORRECTION VALUE |

FIG.15

| 1 | TARGET THICKNESS |
|---|---|
| 2 | SECOND INTERBATCH THICKNESS CORRECTION VALUE |
| 3 | THIRD INTERBATCH THICKNESS CORRECTION VALUE |
| ...... | |
| N | NTH INTERBATCH THICKNESS CORRECTION VALUE |

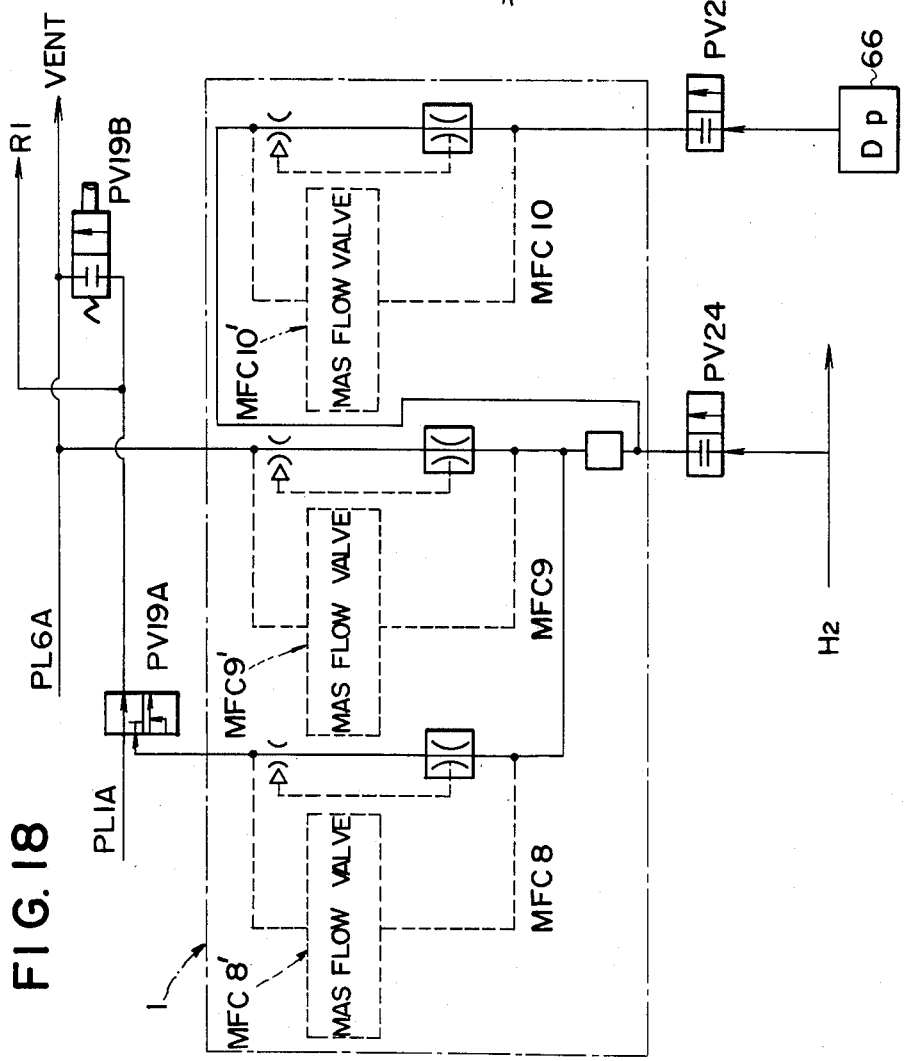

PROCESS CONTROL SYSTEM OF SEMICONDUCTOR VAPOR PHASE GROWING APPARATUS

This is a continuation of application Ser. No. 657,146, filed Oct. 3, 1984, which was abandoned upon the filing hereof.

BACKGROUND OF THE INVENTION

This invention relates to semiconductor vapor phase growing apparatus, and more particularly to a process control system capable of readily preparing and executing a program for conveniently executing the process control of the vapor phase semiconductor growing apparatus.

As apparatus for mass producing monocrystalline semiconductors is presently used semiconductor vapor phase growing apparatus. In such growing apparatus, it is important to readily and accurately set such parameters as the flow quantities of various gases used, the temperature in a reaction furnace, etc. as process steps in the reaction furnace process.

To solve these problems I have invented a process control system for semiconductor vapor phase growing apparatus comprising a reaction furnace in which vapor phase growth is made on a substrate of silicon or like semiconductor, means for heating the substrate, a pipe line network interconnecting the reaction furnace and the sources of various gases necessary for the vapor phase growth, valve means provided for the pipe line network for admitting into the reaction furnace desired quantities of the gases and control means for controlling the valve means. The control means includes a group of process programs containing a time for designating the process of the vapor phase growth in the reaction furnace and information regarding the gases employed, their flow quantities and furnace temperature, and a system program for decoding the process program group to form control signals for the valve control means. Such a process control system was disclosed in U.S. Pat. No. 4,430,959 issued on Feb. 14, 1984, the disclosure of which is hereby incorporated by reference.

More particularly, the semiconductor vapor phase growing apparatus disclosed in this U.S. Patent comprises a plurality of reaction furnaces which are programmably controlled by a common process control system. However, in the prior art process control system, various control objects are adjusted manually. For example, at each step of forming a desired epitaxially grown layer, the size of wafer used is measured and the control object is adjusted again according to the result of measurement so that there is a large probability of erroneous adjustment of the control object, thus increasing the percentage of rejects. For the purpose of preventing manufacturing of rejects, care should be taken not to erroneously measure the wafer and adjust the control object, which increases the work load of an operator.

When preparing a desired semiconductor wafer by using a vapor phase growing apparatus of the type described above, a vapor phase grown layer having a desired thickness and resistivity can be obtained when the types and flow quantities of the gases being used, operating time and the temperature of the reaction furnace are suitably selected. For this reason, the thickness and the resistivity are most important as target values of the vapor phase grown layer thus obtained. The result of measurement of the thickness and the resistivity of the vapor phase grown layer shows that the thickness (in $\mu$/min.) is linearly related to the quantity (g/min.) of source gas ($SiCl_4$, $SiH_2Cl_2$, etc.) as shown in FIG. 1, and that the resistivity (ohm-cm) has a relation shown in FIG. 2 with respect to the logarithmic value of the quantity (cc/min.) of a dopant gas per unit time (an N type dopant gas such as $B_2H_6$ or a P type dopant gas such as $PH_3$). In the measurements shown in FIGS. 1 and 2, hydrogen gas $H_2$ was used as the reference base gas at a rate of 80 l/min. Consequently, from the result of measurement, the thickness and the resistivity, the target values of the vapor phase grown layer formed on the semiconductor wafer can be defined as the functions of the quantities of the source gas and the dopant gas. Accordingly, where predetermined target values are set, the quantities of the source gas and the dopant gas can be determined so that opening, closing and degree of opening of the valve devices and the temperature in the reaction furnace which are to be process controlled can readily be calculated, and the process program can also be readily prepared.

Where a number of batch operations are made for obtaining identical wafers with the same process program by repeatedly using the same reaction furnace of the semiconductor vapor phase growing apparatus, the thickness and the resistivity of the wafer tend to vary at each batch operation as shown in FIGS. 3 and 4, for example. It is considered that such tendency is caused by the fact that the interior of the reaction furnace becomes contaminated after a number of operations over a long period. For example, such tendency occurs when a feedback control system which detects from outside the temperature in the reaction furnace is used to control the heating temperature. Such error is also caused by the fact that a vapor phase grown layer is also formed on a support (sucepta) supporting the wafer, thereby gradually changing the atmosphere surrounding the wafer. Further, such tendency does not always change linearly with increase in the number of batch operations. In other words, it was confirmed that respective vapor phase growing apparatus have their own specific characteristics. For this reason, the process control of the semiconductor vapor phase growing apparatus can be made more accurate by patternizing the tendency of parameters to change in accordance with the number of batch operations so as to correct the content of the program at each batch operation.

Furthermore, in the semiconductor vapor phase growing apparatus of the type described above wherein various gases are supplied to the reaction furnace under the control of a programmable process control, the flow control apparatus plays an important role. The flow control apparatus usually comprises sensors and valves of various types, and the flow quantities of the gases detected by the sensors are compared with set flow quantities for automatically adjusting the degree of openings of the valves. Although a highly accurate control performance is required, the valves are liable to become faulty owing to their complicated construction. Accordingly, when any one of the valves becomes faulty, the percentage of rejects increases greatly. In the past, when such a problem occurs, the abnormal condition of the valve is detected for issuing an alarm which stops the operation of the vapor phase growing apparatus thus decreasing productivity. Moreover, since repair or renewal of a faulty valve is made manually, it takes a long time before resuming the normal operation.

SUMMARY OF THE INVENTION

It is an object of this invention to provide a novel control system of a semiconductor vapor phase growing apparatus for growing an N type or P type semiconductor epitaxial layer on such semiconductor substrate as a silicon wafer capable of mass producing monocrystalline semiconductors having accurate thickness and resistivity by programmably setting the relation between the quantities of source gas and dopant gas, and the sequence time.

Another object of this invention is to provide a control system of the type just mentioned wherein the set relation between the quantities of the source gas and the dopant gas, and the sequence time is corrected in accordance with the patterns of thickness and resistivity which vary according to the number of batch operations of the semiconductor growing operations.

Still another object of this invention is to provide an improved process control system of the type described above wherein when a given valve becomes faulty the flow of gas is quickly transferred to an auxiliary valve connected to substitute for the given valve so as not to interrupt continuous operation of the vapor phase semiconductor growing apparatus.

According to this invention there is provided a process control system of a semiconductor vapor phase growing apparatus comprising a reaction furnace in which a semiconductor is grown on a substrate in a vapor phase; means for heating the substrate; a plurality of sources of different gases necessary for the vapor phase growth of the semiconductor; a pipe line network interconnecting the reaction furnace and the sources of different gases; valve means provided for the pipe line network for supplying desired quantities of the gases to the reaction furnace; and control means for supplying control signals to the valve means, wherein the control means comprises means for preparing a process program inputted with thickness data and resistivity data regarding a vapor phase grown layer formed on the substrate, for selectively setting optimum values of flow quantities of the different gases and a sequence time, the optimum values being used to prepare a sequence program.

In a modified embodiment of this invention, the control means further comprises means for correcting the process program such that the thickness and resistivity of the vapor phase grown semiconductor layer will approach predetermined target values of the thickness and resistivity.

In another modification, the valve means includes main mass flow valves, auxiliary mass flow valves corresponding to respective main mass flow valves and transfer valves which connect one of the auxiliary mass flow valves in parallel with a corresponding main mass flow valve when the same becomes faulty and disconnects the faulty main mass flow valve.

BRIEF DESCRIPTION OF THE DRAWINGS

In the accompanying drawings:

FIG. 8 is a chart showing one example of a process program executed by a process control device of the control system shown in FIG. 7;

FIG. 9 shows a format showing the basic construction of a sequence program utilized in the process control system embodying the invention;

FIG. 15 shows a data table showing interbatch thickness correction values;

FIG. 16 shows a data table showing interbatch resistivity correction values;

FIG. 18 is a connection diagram showing a modification of the mass flow valves shown in FIG. 6;

FIG. 19 shows one main mass flow valve and an auxiliary mass flow valve to be connected in parallel therewith;

DESCRIPTION OF THE PREFERRED EMBODIMENTS

Figure 5:
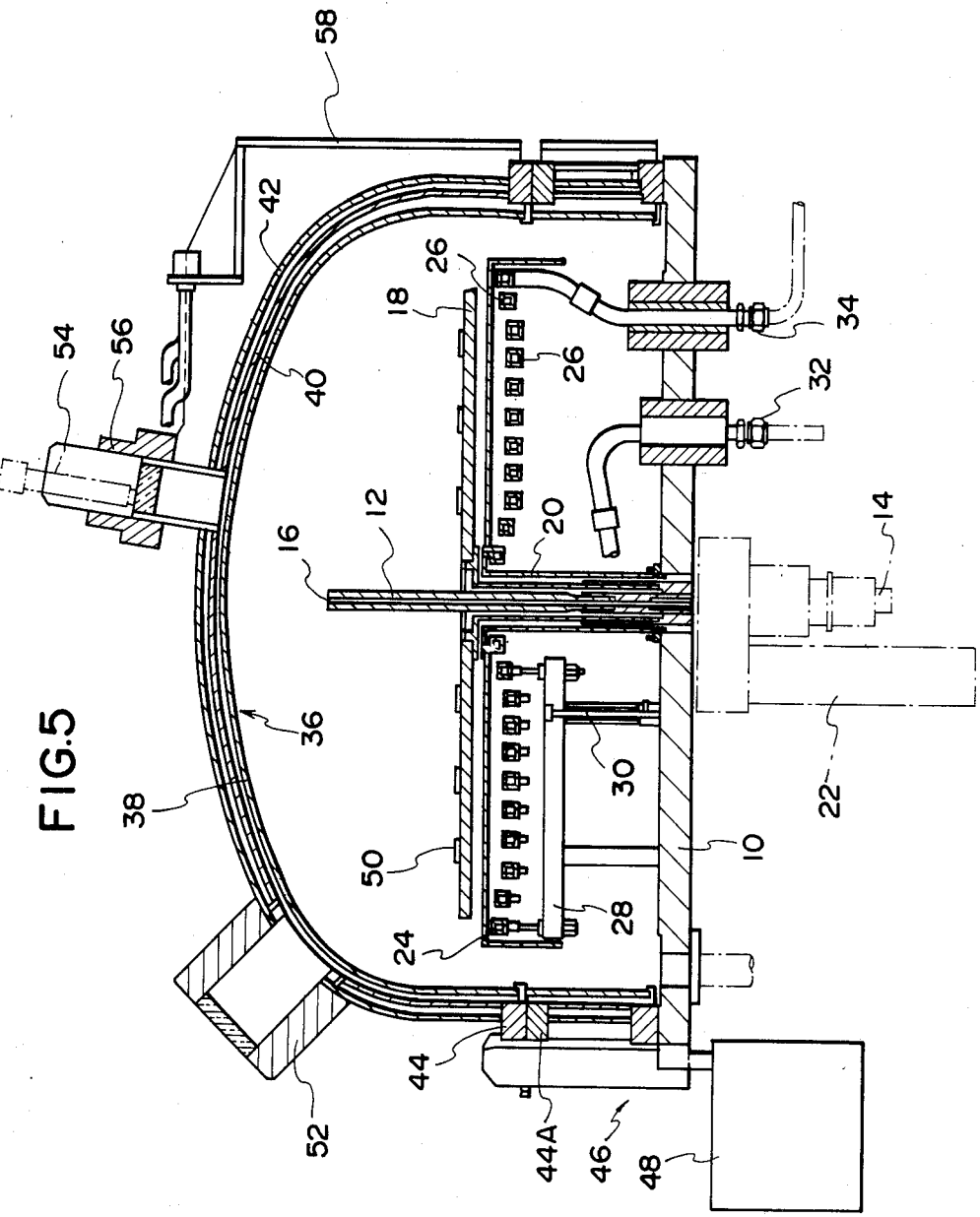
FIG. 5 is a sectional view showing the construction of a semiconductor vapor phase growing apparatus to which the process control system according to this invention is applied.

The reaction furnace of the semiconductor growing apparatus shown in FIG. 5 comprises a bottom plate 10, a pipe 12 extending through the center of the bottom plate 10 for introducing gases utilized for the vapor phase growth into the reaction furnace. The gases are supplied into pipe 12 through a lower input port 14 and ejected into the reaction furnace through an upper ejection port 16. A rotary member adapted to support a supporting disc 18 is disposed to concentrically surround the pipe 12 and is driven by an electric motor 22 through reduction gears, not shown. Beneath the supporting disc 18 is disposed an induction heating coil 26 with a cover 24 interposed therebetween. The coil 26 is supported by an insulating plate 28 secured to the upper surface of the bottom plate 10 through bolts 30. The opposite ends of the coil 26 are connected to an external source of high frequency current, not shown, through connectors 32 and 34 located beneath the bottom plate 10.

A bell-jar shaped cover 36 is mounted on the bottom plate 10. The cover has a three layer construction including a quartz layer 38 on the innermost side, a first stainless steel layer 40 and a second stainless steel layer 42 which are spaced from each other with air gaps therebetween. A flange 44 is provided near the bottom of the cover 36 and is urged against a cooperating flange 44A secured to the bottom plate 10 by a clamping member 46 actuated by an air piston cylinder assembly 48. An inspection window 52 is provided for a portion of the cover 36 for inspecting from outside the supporting disc 18 and wafers 50 mounted thereon. Also, a temperature detection window 56 is provided including a sensor 54 which detects the temperatures of the wafers 50 and of the supporting disc by light projected through the quartz layer 38.

There is also provided a bracket 58 integral with the cover 36. The bracket is moved in the vertical direction by the piston of a piston-cylinder assembly, not shown, so as to raise the cover 36 when exchanging the wafers 50 on the supporting disc 18.

Figure 6:
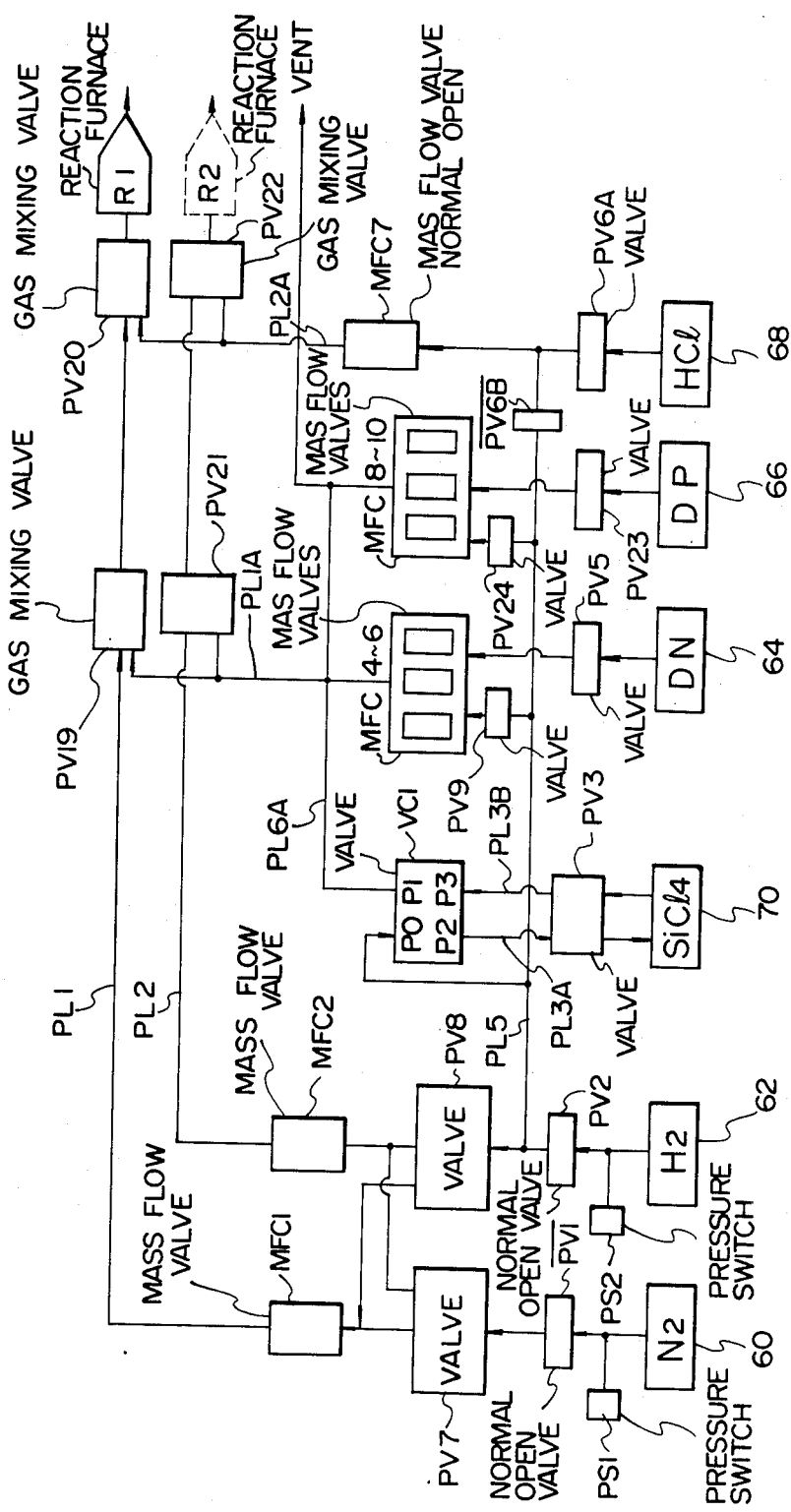
FIG. 6 is a block diagram showing a pipe line network for supplying gases to the semiconductor vapor phase growing apparatus shown in FIG. 5.

FIG. 6 shows a pipe line network of various gases supplied to the reaction furnace shown in FIG. 5. More particularly, in FIG. 6, reference characters 60, 62, 64, 66 and 68 designate respective gas sources or chambers in which gases of $N_2$, $H_2$, $D_N$ (N type dopant), $D_P$ (P type dopant) and HCl are sealed. Reference numeral 70 designates a bubbling chamber filled with liquid $SiCl_4$ or $SiHCl_3$.

A pressure switch PS1, a normal open valve PV1 (hereinafter normal open valves are added with "-") and a valve PV7 are connected in a pipe line extending upward from the chamber 60. In the same manner, a pressure switch PS2, and valves PV2 and PV8 are connected in a pipe line extending upward from the chamber 62. The outputs of valves PV7 and PV8 are commonly connected to a pipe line PL1 via a mass flow valve MFC1. Between the pipe line PL1 and the reaction chamber R1 are provided gas mixing valves PV19 and PV20 so as to admix gases supplied through pipe lines PL1A and PL2A by energizing valves PV19 and PV20.

Two pipe lines PL3A and PL3B extend from the chamber 70 via a valve PV3 to be connected to a valve VC1. Hydrogen gas $H_2$ is admitted into a port P0 of valve VC1, and the hydrogen gas $H_2$ is introduced into the bubbling chamber 70 via a port P2, pipe line PL3A and valve PV3 so as to effect bubbling liquid $SiCl_4$ in the bubbling chamber 70. Accordingly, a gaseous mixture of evaporated $SiCl_4$ and $H_2$ is formed in the upper space of the bubbling chamber 70, the mixture being conveyed to a pipe line PL6A via valve PV3 in the pipe line PL3B and a input port P3 and an output port P1 of the valve VC1.

Mass flow valves MFC4, MFC5 and MFC6 are connected in a pipe line extending upward from chamber 64 sealed with an N type dopant gas, via valve PV5. The input ports of these mass flow valves are connected to a pipe line PL5 passing $H_2$ gas via a valve PV9 so as to supply a mixture of hydrogen gas $H_2$ and the N type dopant gas to an output pipe line PL1A.

Similar pipe line network is provided for a pipe line extending upward from chamber 66 sealed with a P type dopant gas. From FIG. 6, it can be noted that valves PV23 and PV24 and mass flow valves MFC8, MFC9 and MFC10 correspond to those described above.

A valve PV6A and a mass flow valve MFC7 are connected in a pipe line extending from chamber 68 sealed with HCl gas and the output of the mass flow valve MFC7 is connected to an input port of a gas mixing valve PV20. The pipe line PL5 is connected to the inlet port of the mass flow valve MFC7 via a valve PV6B.

Figure 7:
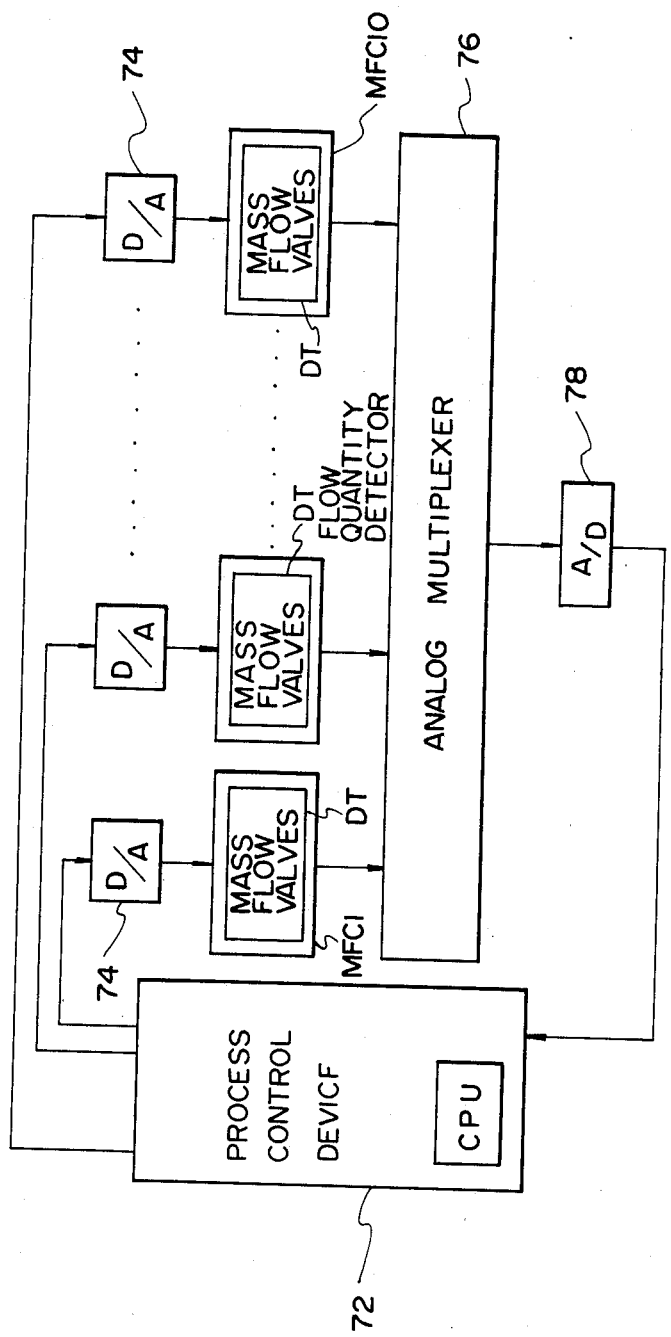
FIG. 7 is a block diagram showing a control system that controls the pipe line network shown in FIG. 6.

Since FIG. 6 is identical to FIG. 7 of U.S. Pat. No. 4,430,959, regarding the detail, reference should be made to the description of FIG. 7 of this U.S. Patent.

FIG. 7 is a block diagram showing a control system of mass flow valves MFC1–MFC10 (except MFC3) which are program controlled in the pipe line network for supplying various gases to the reaction furnace shown in FIG. 6. In FIG. 7 there is provided a process control device 72 containing a central processing unit (CPU) giving instructions to respective mass flow valves in accordance with predetermined process programs, the instructions being supplied to the mass flow valves MFC1–MFC10 respectively through digital analog (D/A) converters 74. The outputs of flow quantity detectors DT provided for respective mass flow valves are sequentially derived through an analog multiplexer 76 and the multiplexed signals are supplied to the process control device 72 via an analog digital (A/D) converter 78.

The process program control operation for the vapor phase growth of semiconductors in the reaction furnace shown in FIG. 5 by using the control system shown in FIGS. 6 and 7 will now be described with reference to a typical process program shown in FIG. 8.

In FIG. 8, the content of a process program PP(1) designates an $N_2$ purge meaning that nitrogen gas is supplied for 3 minutes at a flow rate of FN 1 l/min. Accordingly, nitrogen gas is admitted into the reaction chamber R1 through valves PV1, PV7, MFC1, PV19 and PV20 and flows out from the reaction furnace, thereby effecting purging thereof. At this time, the flow quantity FN 1 l/min. is applied from the process control device 72 shown in FIG. 7 as a voltage instruction.

A process program PP(2) shows an $H_2$ purge in which hydrogen gas is supplied to the reaction furnace at a flow rate of FH 2 l/min. The hydrogen gas is introduced into the reaction furnace R1 via valves PV2, PV8, MFC1, PV19 and PV20, thus effecting a purging in the same manner as nitrogen gas.

The next process program PP(3) (hereinafter designated as PP(i)) shows a HEAT ON(1) in which the quantity of hydrogen supplied to the reaction furnace is FH 2 l/min. and the states of respective valves are not changed. The induction heating furnace is set to a level of a first stage and high frequency current is supplied to the high frequency induction coil for 3 minutes to obtain a first set temperature.

At the next process program PP(4), a second stage level is set to obtain a set temperature of $\theta 2°$ C. with the same quantity of flow of the hydrogen for heating for 3 minutes.

A process program PP(5) shows a HCl VENT. The contents of setting of this case are: heating time of 3 minutes; the flow quantity of hydrogen of FH 2 l/min., and the flow quantity of HCl of FHCL l/min. HCl flows into the reaction furnace R1 via valves PV6A, MC7 and PV20 and is discharged through its vent port.

The flow quantity FHCl of HCl is set by a voltage instruction supplied to the mass flow valve MFC7.

A process program PP(6) shows an HCl ETCH and continues for 3 min. Consequently, according to a process program PP(5), HCl is admixed with hydrogen gas by gas mixing valve PV20 and the resulting gas mixture is supplied to the reaction furnace R1.

A process program PP(7) shows an $H_2$ purge which is continued for 3 minutes in the same manner as in process program PP(2).

A process program PP(8) shows a HEAT DOWN, according to which the temperature of the reaction furnace is set to $\theta 2°$ C. to $\theta 3°$ C. Upon completion of the process program persisting for 3 minutes, the preparation for the vapor phase growth substantially completes, and the program is advanced to the next process program PP(9) which shows a EPi VENT(1) and according to this program, hydrogen is supplied at a rate of FH 2 l/min, the P type dopant gas $D_P$ at a rate of FDP cc/min., $SiCl_4$ at a rate of FSI g/min., during 3 minutes. Hydrogen gas in chamber 62 is admitted into chamber 70 through valves PV2, VC1 and PV3 and a gaseous mixture of $SiCl_4$ and $H_2$ is supplied to pipe line PL6A via valves PV3 and VC1. Since P type dopant gas $D_P$ is supplied to the pipe line PL6A from the chamber 66 via valves PV23, MFC8, MFC9 and MFC10, the P type dopant gas is admixed with $H_2$ and $SiCl_4$ and the mixture is discharged to VENT.

A process program PP(10) shows an EPi DEPO in which the flow quantities of various gases are the same as the process program PP(9) and valve PV19 is opened. This state persists for 3 minutes. Consequently, gases $D_P$, $H_2$ and $SiCl_4$ supplied to pipe line PL1A are admixed by the gas mixing valve PV19. The gas mixture thus obtained is introduced into the reaction furnace R1 through the main port of valve PV26 for vapor phase growing P type semiconductors on the wafers supported by the support. In this case, the growing reaction is a reversible reaction of hydrogen reduction type shown by the following equation.

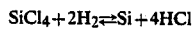

$$SiCl_4 + 2H_2 \rightleftarrows Si + 4HCl$$

In this manner, pure Si is deposited or grows on the wafers. Usually, phosphine $PH_3$ is used as the P type dopant gas. Upon completion of this process program PP(10) which persists for 3 minutes, the vapor phase growth is completed.

A process program PP(11) shows an $H_2$ purge according to which hydrogen is supplied for 3 minutes at a rate of FH 2 l/min. in the same manner as the process program PP(2).

Process programs PP(12), PP(13) and PP(14) are not used in this embodiment.

A process program PP(15) shows HEAT OFF according to which the supply of electric power to the induction heating coil is interrupted. In this case, the time is set to 3 minutes by taking into consideration the time required for lowering the furnace temperature. In this case too, hydrogen is supplied at a rate of FH 2 l/min.

A process program PP(16) shows an $H_2$ purge according to which $H_2$ is supplied at a rate of FH 2 l/min. for 3 minutes.

A process program PP(17) shows an $N_2$ purge according to which nitrogen gas is supplied for 3 minutes at a rate of FN 17 l/min.

By executing the process programs PP(1) through PP(17), one cycle of vapor phase growth is completed.

In the foregoing vapor phase growing reaction according to the process program control, a P type silicon semiconductor was grown on the wafers, but where it is desired to obtain an N type silicon semiconductor, the N type dopant gas $D_N$ is supplied via valves PV5, PV9, MFC4, MFC5 and MFC6

In this case, diborane $B_2H_2$ is a suitable N type dopant.

It should be understood that the invention is also applicable to any type of semiconductor, for example GaAs and germanium.

The construction of the process control device programming the vapor phase growing operation will now be described with reference to FIG. 9 showing a format of the process programs constituting a process program group (PPGi) of one step stored in a program memory device of the CPU in the process control device 72 shown in FIG. 7. This program sequence group stores the data regarding the sequence number, data size, sequence time, data bit code, temperature or quantity of gas flow for each sequence unit and continuously includes programs PP(1) through PP(N).

Figure 1:
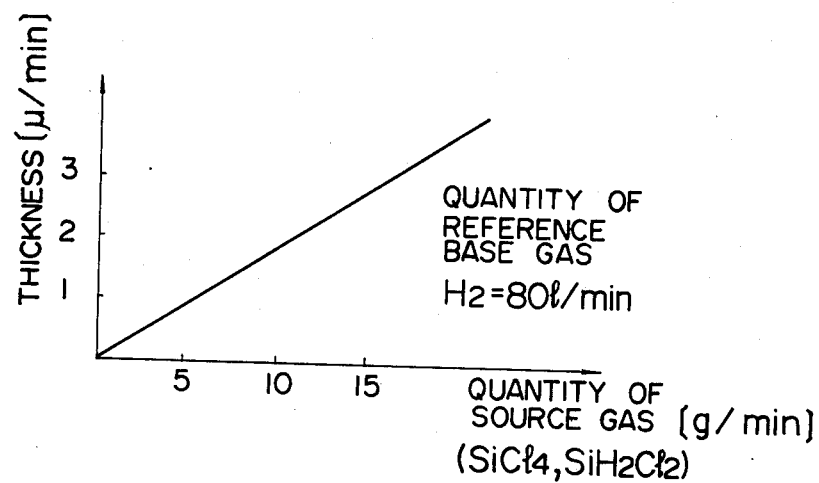
FIG. 1 is a characteristic curve showing the relation between the thickness of a vapor phase grown semiconductor layer and the quantity of source gas.
Figure 10:
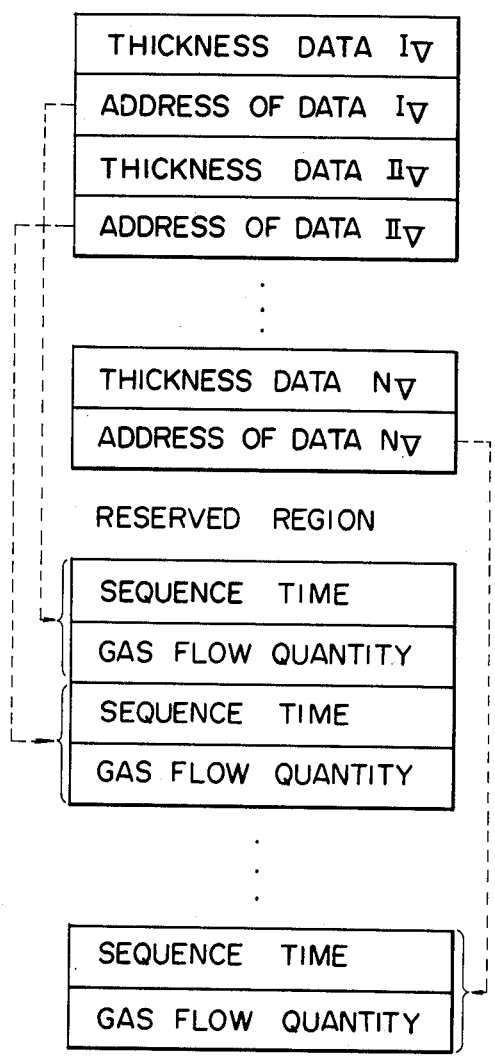
FIG. 10 shows a thickness data table stored in the process control system according to this invention.

FIG. 10 shows a format of a data table regarding the thickness similarly stored in a data memory device of the CPU in the process control device 27. The thickness of the vapor phase grown layer is divided into sections by utilizing the relation shown in FIG. 1 and an optimum sequence time and the source gas flow quantity are set in the thickness data table. More particularly, in FIG. 10, thickness data $I_V$-$N_V$ and addresses storing these data are sequentially stored in the data memory device for respective thickness data and corresponding sequence data and the source gas flow quantity are sequentially stored in the data memory device for each address designated by the thickness data.

Figure 2:
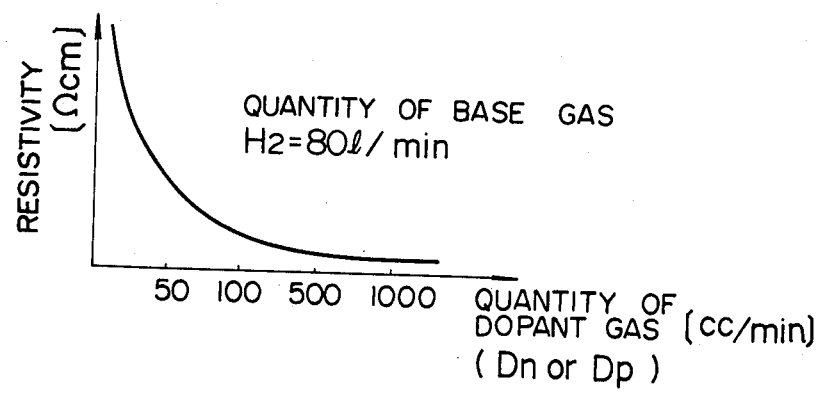
FIG. 2 is a characteristic curve showing the relation between the resistivity of the vapor phase grown layer and the quantity of a dopant gas.
Figure 11:
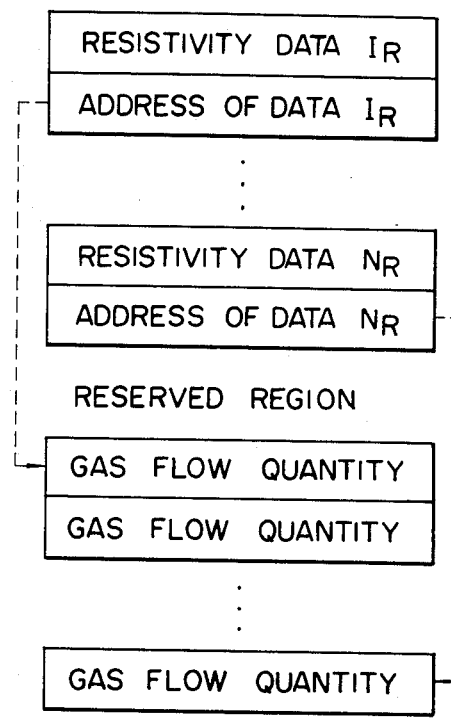
FIG. 11 shows a resistivity data table stored in the process control system of this invention.

FIG. 11 shows a format of a resistivity data table also stored in the data memory device of the CPU in the process control device 72. The resistivity of the vapor phase grown layer is divided into a plurality of sections according to the relation shown in FIG. 2, and an optimum dopant gas flow quantity of each divided section is set in the resistivity data table. More particularly, in FIG. 11, resistivity data $I_R N_R$ and addresses storing the data are sequentially stored in the data memory device for respective resistivity data, and thereafter dopant gas flow quantities corresponding to addresses designated by the resistivity data are sequentially stored in the data memory device.

To prepare process programs for given steps by using the thickness data table and the resistivity data table stored in the data memory device in the CPU, the following procedures are used.

Figure 13:
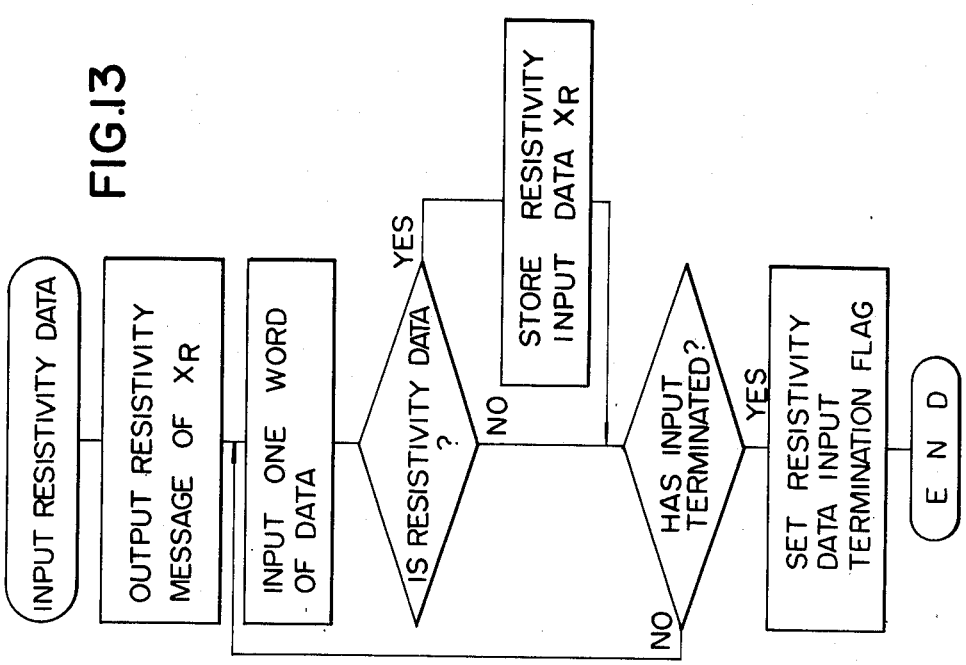
FIG. 13 shows an input flow chart of resistivity data inputted to the process control device of this invention for preparing a predetermined process program.
Figure 12:
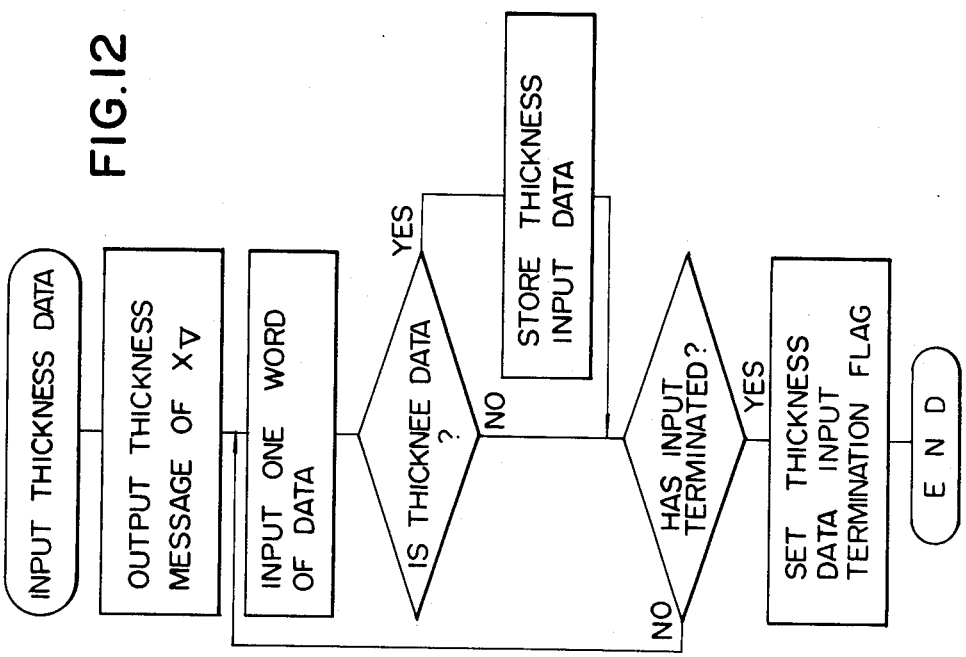
FIG. 12 shows an input flow chart of thickness data inputted to the process control device of this invention for preparing a predetermined process program.
Figure 14:
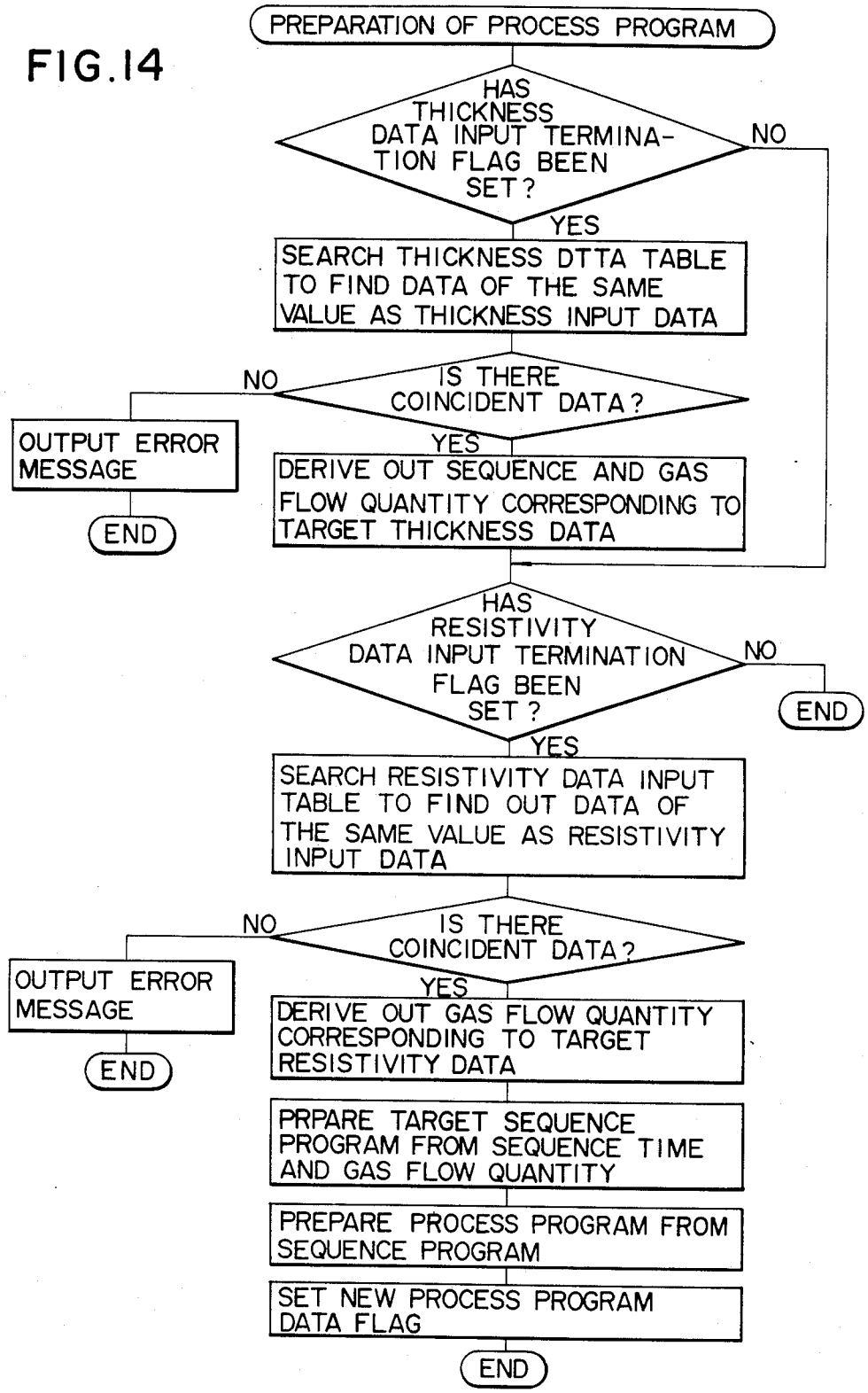
FIG. 14 shows a flow chart for preparing a desired process program from the thickness data and the resistivity data inputted according to the input flow charts shown in FIGS. 12 and 13.

At first, the thickness data and the resistivity data are stored in the data memory device in the CPU. Inputting of the thickness data is done according to a flow chart shown in FIG. 12 and completed when a thickness data input termination flag is set. Inputting of the resistivity data is done according to a flow chart shown in FIG. 13 and is completed when a resistivity data input termination flag is set. The thickness data input termination flag and the resistivity data input termination flag which are set in the data memory device of the CPU are prepared by searching the thickness data table and the resistivity data table shown in FIGS. 10 and 11, preparing a process program of a target program shown in FIG. 9 and then setting the process program in the data flag.

More particularly, to prepare a process program for preparing a target sequence capable of effecting a desired vapor phase semiconductor growth by inputting predetermined thickness data and resistivity data, a thickness data input termination flag is firstly set. Then the thickness data table shown in FIG. 10 is searched to find out the same data as the thickness input data. As a result of the search, when the same data is found, a sequence time and gas flow quantity corresponding to the data are read out and the read out data are temporarily stored in a memory device. After that, the resistivity data input flag is set. Then a data in the resistivity data table shown in FIG. 11 and having the same value as the resistivity input data is searched. When the same data is found, a gas flow quantity corresponding thereto is read out into a memory device. This data and the data temporarily stored in the memory device are used to prepare a target sequence. The process program shown in FIG. 9 is prepared based on the target sequence and this process program is set in a data flag to complete a process program.

Figure 3:
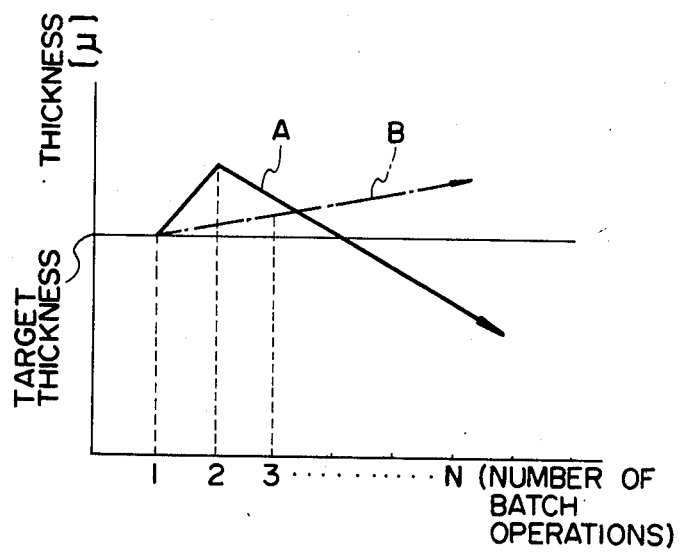
FIG. 3 is a graph showing the relation between the number of batch operations and the thickness of the layer.
Figure 4:
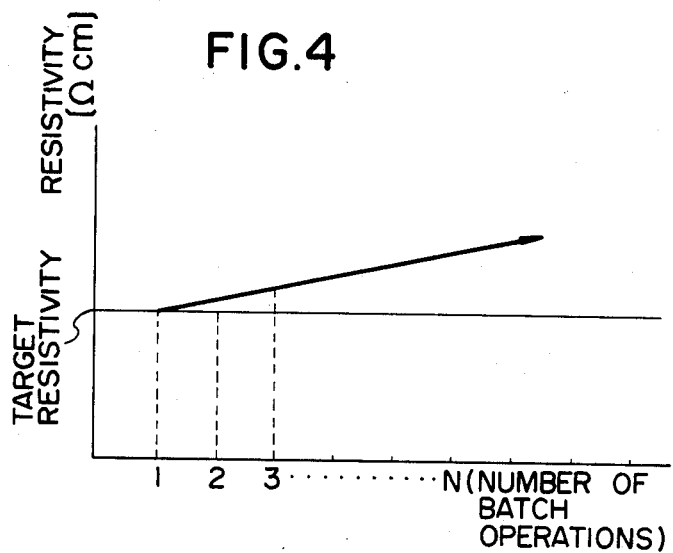
FIG. 4 is a graph showing the relation between the number of batch operations and the resistivity.

However, when the semiconductor vapor phase growing apparatus is controlled by the process control device by using the process program thus prepared, at the first batch operation, products having substantially the same target values can be obtained, but after a plurality of batch operations have been made by using the same device and the same program, the thickness and resistivity change, as shown in FIGS. 3 and 4. Consequently, it is possible to always manufacture products having target thickness and resistivity by correcting gas flow quantity or sequence time by correcting for such variation tendency or pattern.

When preparing the process program, regarding the target thickness, the sequence time is determined in proportion to the gas flow quantity under a given temperature condition and the gas flow quantity is expressed in terms of a unit of $\mu$/min. which is generally called a growing speed. In contrast, the target resistivity is independent from the sequence time but only logarithmically proportional to the gas flow quantity. Consequently, the value for effecting the correction can be made by using such proportionality.

One example of an interbatch correction of the target thickness and the target resistivity with a preset process program is as follows.

(1) Interbatch Correction of the Target Thickness

When it is assumed that at the time of the second batch operation the target thickness increases by $t_2$ and that at the time of the Nth batch operation the target thickness increases by $t_N$, the interbatch correction value can be expressed by the following equation.

The second interbatch thickness correction value $\Delta t_2$ (in min. or sec.):

$$\Delta t_2 = t_2/\text{growing time}$$

The Nth interbatch thickness correction value $\Delta t_N$ (in min. or sec.):

$$\Delta t_N = t_N/\text{growing time}$$

By using these correction data, an interbatch thickness correction data table shown in FIG. 15 is prepared and stored in the data memory device of the CPU of process control device 72.

To perform an interbatch correction of the target thickness, the data table shown in FIG. 15 is searched at each batch operation to read out a desired interbatch thickness correction data which is used to change a process program regarding the sequence time.

(2) Interbatch Correction of Target Resistivity

Similar to the target thickness, the target resistivity also tends to vary at each batch operation so that it is possible to prepare interbatch resistivity correction value in the same manner as the interbatch thickness correction value described above. In this case, since the resistivity is logarithmically proportional to the ratio between flow quantities of the reference base gas (for example hydrogen gas) and the dopant gas, the flow quantity of the reference base gas or the dopant gas can be used as the correction value. However, since the reference base gas has an influence upon the target thickness too, it is advantageous not to change the flow quantity thereof, but in a certain case it may be changed together with the growing speed of the target thickness.

A data table of the interbatch resistivity correction values as shown in FIG. 16 is prepared by using the flow quantity of the dopant gas as the correction value, and the data table is also stored in a data memory device of the CPU of the process control device 72.

Accordingly, to make an interbatch correction of the target resistivity, the table shown in FIG. 16 is searched at each batch operation to take out a desired correction value of the interbatch resistivity so as to change the process program regarding the flow quantity of the dopant gas.

Figure 17:
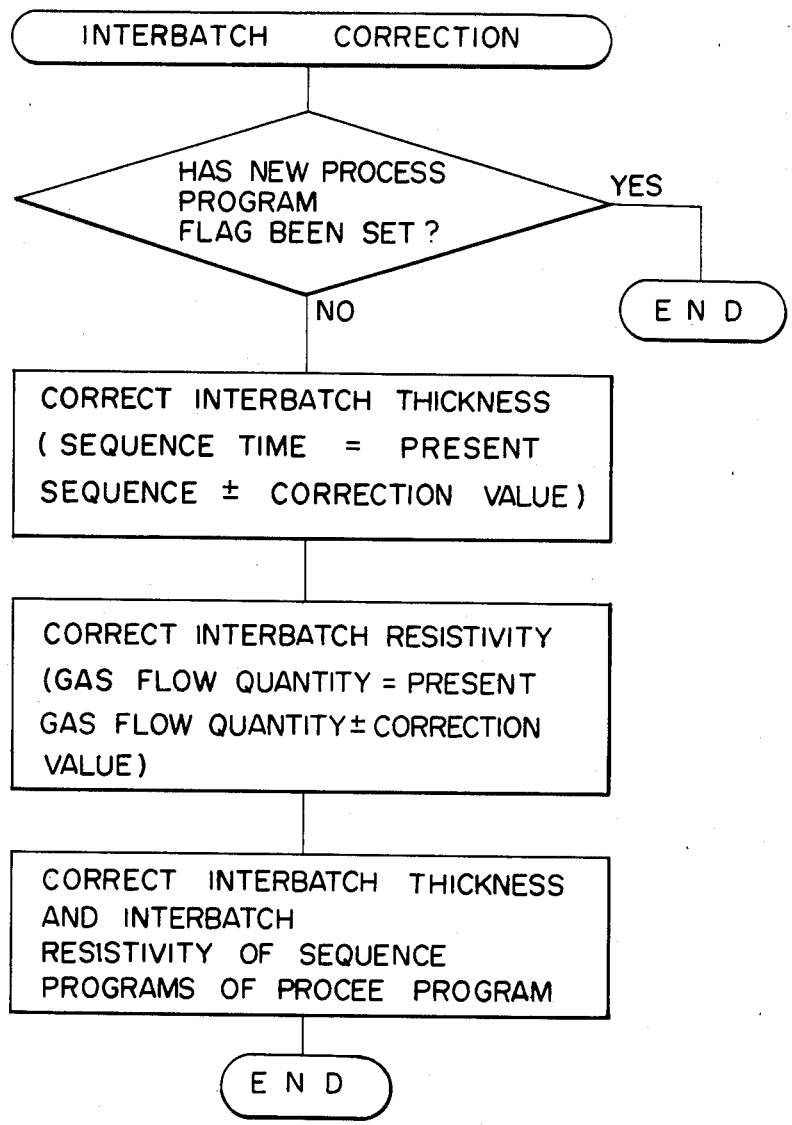
FIG. 17 is a flow chart for effecting interbatch corrections of a process program.

As shown in the interbatch correction flow chart shown in FIG. 17, the interbatch corrections of the target thickness and the target resistivity are made by correcting the sequence time and the dopant gas flow quantity by referring to the number of batches and the data tables shown in FIGS. 15 and 16 and then modifying or rewriting the process program. Such interbatch correction of the process program is made automatically in accordance with the interbatch correction flow chart each time one process step (i.e. batch) terminates.

Instead of using the data tables regarding the interbatch thickness correction value and the interbatch resistivity correction value, the same correction can be made by using suitable arithmetic equations.

As above described, according to this invention, at the time of process control of a semiconductor vapor phase growing apparatus with a program, a data table and a sequence program prepared in accordance with data regarding a desired thickness and resistivity of a product are selected for preparing an optimum process program so that it is possible to prevent errors caused by manually setting control values thereby making easy an excellent process control.

Furthermore, according to this invention, the program is corrected by correction values of the sequence time and gas flow quantity corresponding to variations of the target thickness and the target resistivity caused by the increase in the number of batch operations so as to mass-produce products having excellent and uniform quality.

Especially, where the rating or type of the product is to be changed, as it is possible to rapidly and correctly change the process program with an electronic computer, not only the process steps can be changed readily but also the manufacturing cost can be reduced.

Moreover, according to this invention, a plurality of identical semiconductor vapor phase growing apparatus can be controlled simultaneously or alternately by a common process control device thereby improving the productivity.

Furthermore, according to this invention, with reference to a sequence program preset based upon a desired thickness and resistivity of products, changes in a target thickness and target resistivity caused by the increase in the number of batch operations are corrected by values regarding the sequence time and the gas flow quantity corresponding to the changes so as to reprepare the process program so that products having uniform and excellent quality can be mass produced.

FIG. 18 is a block diagram showing flow quantity control apparatus I (MFCs 8-10 shown in FIG. 6) which supplies to the reaction furnace R1 a mixture of base gas $H_2$ and the P type dopant gas $D_P$. FIG. 18 shows the detail of a pipe network shown in FIG. 6.

The flow control apparatus shown in FIG. 18 is controlled by the process programs PP(9) and PP(10) described above. More particularly, according to the process program PP(9), the P type dopant is supplied to mass flow control valve MFC10 via valve PV23. In this case the flow quantity of the mass flow control valve MFC10 is set to 300 cc/min., for example, so as to admix the P type dopant gas with the base gas $H_2$ supplied through valve PV24. The gas mixture thus obtained is then divided to flow respectively through mass flow valve 9 set to 30 l/min., and mass flow valve 8 set to 300 cc/min, for example. With the process program PP(9), however, since valve PV19A is maintained open, all of the gas mixture flows to pipe line PL6A through mass flow valve 9 to be mixed with ($H_2$+$SiCl_4$) and the resulting mixture is discharged to VENT. At the next process program PP(10), valve PV19A is opened so that a portion of the gas mixture flows to pipe line PL1A via mass flow valve MFC8 to be admixed with ($H_2$+$SiCl_4$) and the resulting mixture is supplied to the reaction furnace R1 to effect vapor phase growth of the P type semiconductors on the wafers supported by the supporting member 18.

With the construction thus far described, when any one of the mass flow valves MFC8-MFC10 becomes faulty so that its set flow quantity cannot be maintained, not only the composition of gas mixture would vary but also the speed of the vapor phase growth would vary whereby it becomes impossible to maintain the quality of the products at a constant level.

According to a modification of this invention, as shown in FIG. 18, auxiliary mass flow valves MFC8', MFC9' and MFC10' which are set to pass required flow quantities are connected in parallel with the main mass flow valves MFC8-MFC10 respectively through transfer valves CV. When any one of the main mass flow valves becomes faulty, the transfer valves CV associated therewith are immediately opened for assuring the required flow quantity by the auxiliary mass flow valve. At the same time, the faulty main mass flow valve is disconnected or made inoperative by closing transfer valves associated therewith.

According to this modification, the auxiliary mass flow valves are connected in parallel with respective main mass flow valves shown in FIG. 6 and the abnormal condition of the main mass flow valves is supervized by the CPU of the process control device shown in FIG. 7 so as to substitute an auxiliary mass flow valve for a faulty main mass flow valve.

Figure 20:
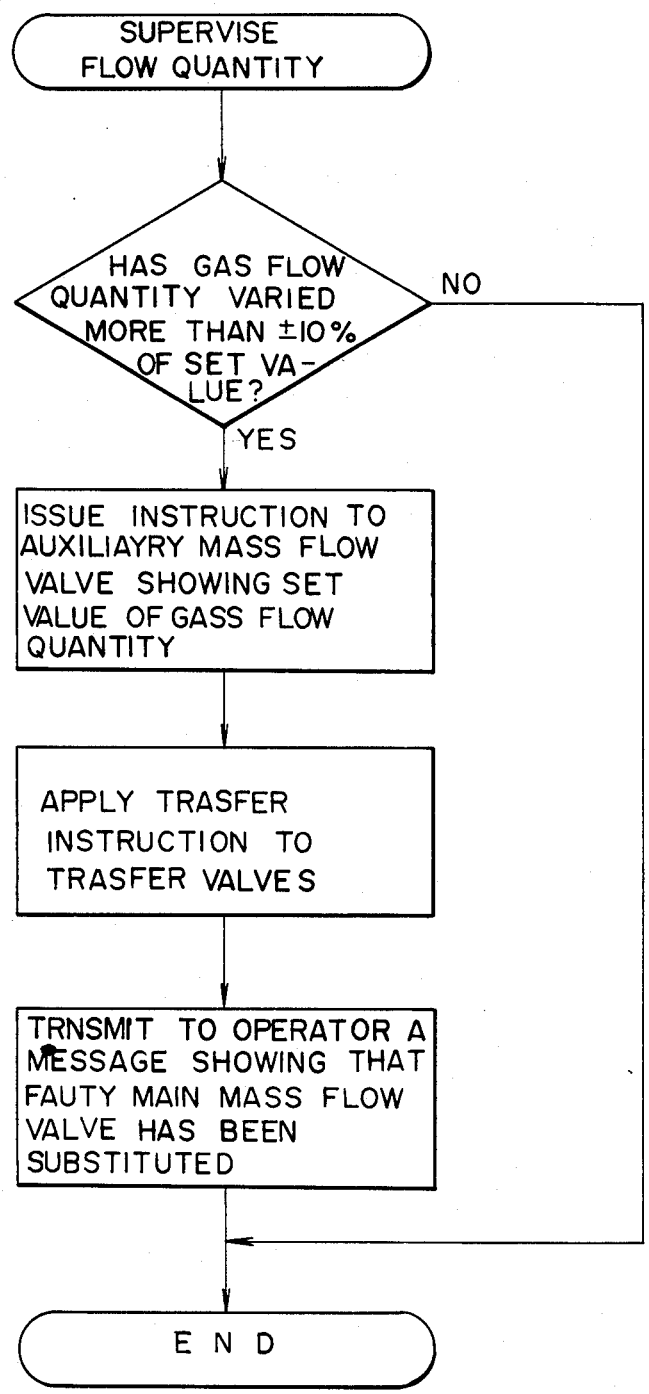
FIG. 20 is a flow chart showing a program controlling various valves shown in FIG. 18 and FIG. 19.

FIG. 20 is a flow chart showing a program stored in the CPU for supervizing the abnormal condition of a main mass flow valve for transferring its function to an auxiliary mass flow valve. More particularly, the CPU issues flow quantity supervizory instructions to the main mass flow valves to judge whether the quantities of the gases flowing therethrough vary by ±10% of the set quantities or not. When the variation exceeds ±10% of the set value, the CPU supplies as an instruction setting a predetermined set value to a corresponding auxiliary mass flow valve as well as instructions to transfer valves associated with the faulty main mass flow valve. As a consequence, the transfer valves are opened to operate the auxiliary mass flow valve corresponding to the faulty main mass flow valve and to isolate the same, thereby assuring desired vapor phase growing operation. Upon completion of such transfer operations, a predetermined program is completed.

Figure 21:
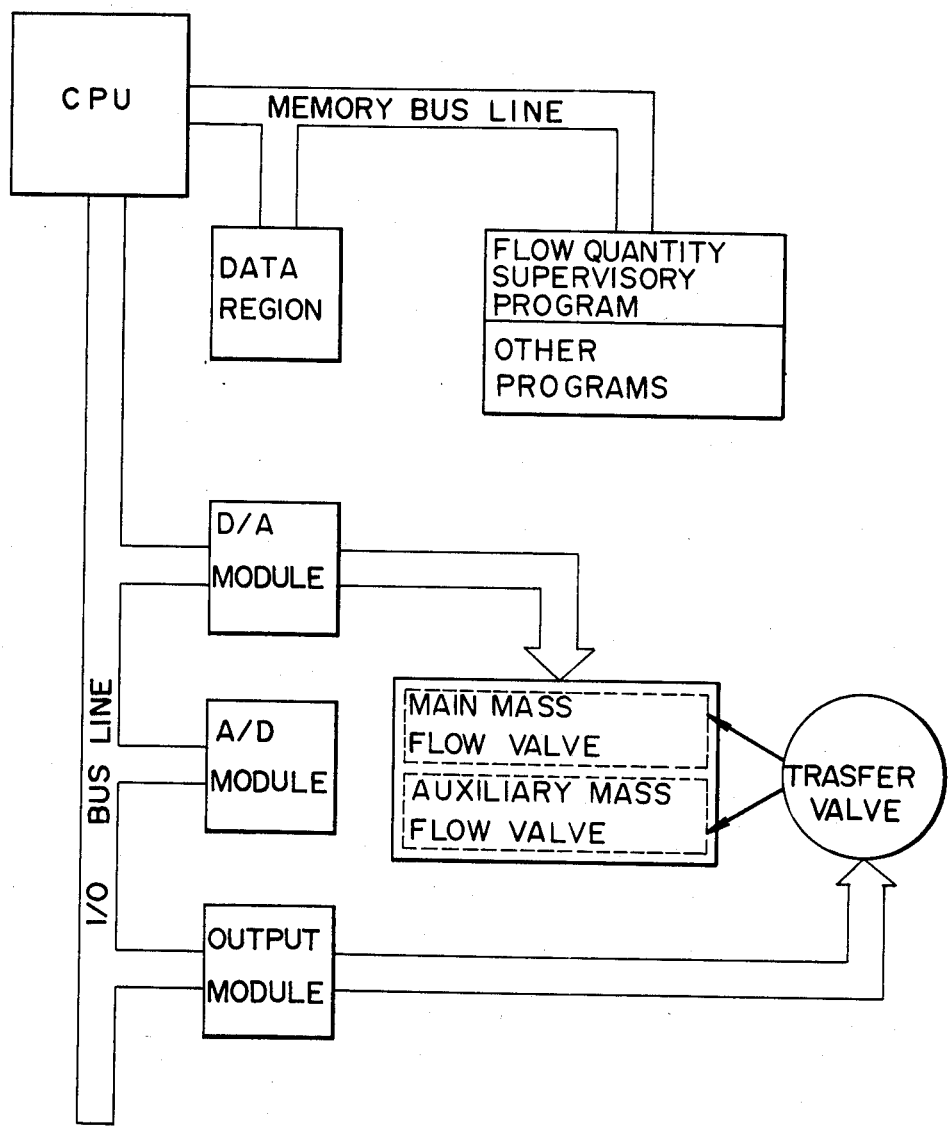
FIG. 21 is a block diagram showing the construction of the process control device executing the program shown in FIG. 20.

The construction of the process control device for executing the program shown in FIG. 20 is shown in FIG. 21 which can be readily understood from the foregoing description regarding the flow chart shown in FIG. 20.

As above described, according to this modification, since an auxiliary mass flow valve is connected in parallel with each main mass flow valve and since whenever the main mass flow valve becomes faulty an auxiliary mass flow valve is substituted, semiconductors having uniform quality can be continuously obtained without interrupting the operation of the semiconductor vapor phase growing apparatus.

What is claimed is:

1. Apparataus for controlling gas flow in a multi-batch semiconductor vapor phase growing system to control batch-to-batch variations in semiconductor thickness and resistivity, comprising:

gas flow control means for controlling a quantity of gas provided to said device;

first memory means storing a process program including gas flow amounts and sequence step timing for a batch process;

second memory means storing gas flow correction values which vary according to batch number;

third memory means storing sequence step timing correction values which vary according to batch number;

processing means for (a) controlling sequence step timing, (b) determining a number of a given batch, (c) determining gas flow and timing correction values for said given batch number, (d) correcting said gas flow amount and said sequence step timing in accordance with the determined correction values, and (e) controlling said gas flow control means and said sequence step timing in accordance with the corrected gas flow amount and corrected sequence step timing.

2. Apparatus according to claim 1 wherein said gas flow control means includes a plurality of main flow valves and a corresponding plurality of auxilliary flow valves, each auxilliary flow valve being connected in parallel with a corresponding main flow valve, said apparatus further including:

main flow valve monitoring means for monitoring a quantity of gas flowing through each said main flow valve; and transfer means for activating an auxilliary flow valve and deactivating a main corresponding flow valve when said monitoring means detects the corresponding main flow valve is faulty.

3. A method for controlling gas flow in a multi-batch semiconductor vapor phase growing system to control batch-to-batch variations in semiconductor thickness and resistivity, comprising the steps of:

controlling a quantity of gas supplied to said device;

storing a process program including gas flow amounts and sequence step timing for a batch process;

storing gas flow correction values which vary according to batch number;

storing sequence step timing correction values which vary according to batch number;

controlling said sequence step timing;

determining a number of a given batch;

determining gas flow and timing correction values for said given batch number;

correcting said gas flow amount and said sequence step timing in accordance with the determined correction values; and controlling said gas flow and said sequence step timing in accordance with the corrected gas flow amount and corrected sequence step timing.

* * * * *